(12) United States Patent
Gao et al.

(10) Patent No.: US 12,225,686 B2
(45) Date of Patent: Feb. 11, 2025

(54) ELECTRONIC DEVICE AND LIQUID COOLING APPARATUS FOR ELECTRONIC DEVICE

(71) Applicant: SHENZHEN MICROBT ELECTRONICS TECHNOLOGY CO., LTD., Guangdong (CN)

(72) Inventors: Yang Gao, Guangdong (CN); Qian Chen, Guangdong (CN); Yuefeng Wu, Guangdong (CN); Haifeng Guo, Guangdong (CN); Zuoxing Yang, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 111 days.

(21) Appl. No.: 17/920,304

(22) PCT Filed: May 19, 2021

(86) PCT No.: PCT/CN2021/094542
§ 371 (c)(1),
(2) Date: Oct. 20, 2022

(87) PCT Pub. No.: WO2022/028037
PCT Pub. Date: Feb. 10, 2022

(65) Prior Publication Data
US 2023/0209769 A1 Jun. 29, 2023

(30) Foreign Application Priority Data

Aug. 7, 2020 (CN) .......................... 202010787647.9

(51) Int. Cl.
*H05K 7/20* (2006.01)
*G06F 1/18* (2006.01)
*G06F 1/20* (2006.01)

(52) U.S. Cl.
CPC ......... *H05K 7/20263* (2013.01); *G06F 1/188* (2013.01); *G06F 1/20* (2013.01); *G06F 2200/201* (2013.01)

(58) Field of Classification Search
CPC ....... H05K 7/20263; G06F 1/188; G06F 1/20; G06F 2200/201
(Continued)

(56) References Cited

U.S. PATENT DOCUMENTS 4,619,316 A * 10/1986 Nakayama ............ F28F 13/187
257/713
4,704,658 A * 11/1987 Yokouchi ............... H05K 7/203
361/698

(Continued)

FOREIGN PATENT DOCUMENTS

CN 101498428 A 8/2009
CN 104093295 A 10/2014
(Continued)

*Primary Examiner* — Anatoly Vortman
(74) *Attorney, Agent, or Firm* — Dickinson Wright PLLC (57) ABSTRACT

An electronic device includes an arithmetic unit layer and a power supply. The arithmetic unit layer comprises at least one arithmetic unit. Each arithmetic unit comprises a first housing in a shape of cuboid. A first side direction of the first housing extends in a first direction. The first housing is provided with first and second openings at both ends in the first side direction thereof to form a coolant passage extending in the first direction. The power supply is stacked with arithmetic unit layer in a second or a third direction. A first side direction of the power supply is aligned with the first side direction of each arithmetic unit. The power supply is provided with third and fourth openings at both ends in the first side direction thereof to form a coolant passage extending in the first side direction of the power supply.

11 Claims, 10 Drawing Sheets

(58) Field of Classification Search
USPC .................................................. 361/679.53
See application file for complete search history.

(56) References Cited

U.S. PATENT DOCUMENTS

| | | | | |
|---|---|---|---|---|
| 4,949,164 | A * | 8/1990 | Ohashi | H01L 23/427 |
| | | | | 165/80.4 |
| 5,270,572 | A * | 12/1993 | Nakajima | H01L 23/4735 |
| | | | | 361/689 |
| 6,588,647 | B2 * | 7/2003 | Yamada | H05K 7/20872 |
| | | | | 165/170 |
| 7,403,392 | B2 * | 7/2008 | Attlesey | H05K 7/20772 |
| | | | | 361/679.48 |
| 9,144,179 | B2 * | 9/2015 | Shelnutt | H05K 7/20809 |
| 10,416,736 | B2 * | 9/2019 | Dupont | H05K 7/20936 |
| 10,645,841 | B1 * | 5/2020 | Mao | H05K 7/20781 |
| 11,375,638 | B2 * | 6/2022 | Cheng | H05K 7/20818 |
| 11,744,043 | B2 * | 8/2023 | Gao | H05K 7/203 |
| | | | | 361/679.53 |
| 11,825,637 | B2 * | 11/2023 | Gao | H05K 7/20818 |
| 2015/0070846 | A1 * | 3/2015 | Shelnutt | H05K 7/20809 |
| | | | | 361/699 |
| 2017/0112017 | A1 * | 4/2017 | Wang | H05K 7/20236 |
| 2017/0265336 | A1 * | 9/2017 | Ichinose | H05K 7/20772 |
| 2017/0290205 | A1 * | 10/2017 | Shepard | H05K 7/20936 |

FOREIGN PATENT DOCUMENTS

| | | | |
|---|---|---|---|
| CN | 106171209 | A | 12/2016 |
| CN | 107911999 | A | 4/2018 |
| CN | 110989787 | A | 4/2020 |
| CN | 111857281 | A | 10/2020 |
| CN | 213149621 | U | 5/2021 |

* cited by examiner

ELECTRONIC DEVICE AND LIQUID COOLING APPARATUS FOR ELECTRONIC DEVICE

CROSS-REFERENCE TO RELATED APPLICATIONS

The present application is a National Stage Entry of International application No. PCT/CN2021/094542 filed on May 19, 2021, which claims the priority to Chinese Patent Application No. 202010787647.9, filed on Aug. 7, 2020 and entitled "ELECTRONIC DEVICE AND LIQUID COOLING APPARATUS FOR ELECTRONIC DEVICE", which is incorporated in its entirety herein by reference.

TECHNICAL FIELD

The present application relates to the field of electronic devices, and in particular, to an electronic device and a liquid cooling apparatus for the electronic device.

BACKGROUND

With the rapid development of artificial intelligence and the continuous upgrading of electronic devices, the amount of data processed by electronic devices is increasing, and the computing density is getting higher, and chips such as a central processing unit (CPU) and a graphics processing unit (GPU) generate more heat. At present, most electronic devices use conventional air-cooling heat dissipation systems for heat dissipation. However, the air-cooling heat dissipation systems have disadvantages of high noise, low heat dissipation efficiency, and high environmental requirements, and the air-cooling heat dissipation systems can hardly meet the heat dissipation requirements of high-power density devices.

In recent years, some new liquid cooling heat dissipation technologies have gradually emerged. Compared with conventional air-cooling technologies, liquid cooling technologies have inherent advantages such as low noise, low power consumption, and low environmental requirements. For electronic devices with a high power density layout, corresponding liquid cooling heat dissipation solutions are suitable. Most of the existing liquid cooling electronic devices are obtained through transformation by directly removing fans from air-cooling electronic devices and other operations. The fluid structure inside the electronic device is not suitable for the sufficient heat exchange between the coolant and the heating element in the liquid cooling system, which affects the heat dissipation efficiency. Because the electronic device needs to be immersed in the coolant, and the electronic device needs to be lifted out during maintenance, the maintenance operations are cumbersome. Therefore, it is necessary to design a new liquid cooling electronic device to resolve the foregoing problems.

SUMMARY

Based on this, one purpose of the present application is to provide an electronic device and a liquid cooling apparatus for the electronic device.

According to an aspect of the present disclosure, there is provided an electronic device, including:

at least one arithmetic unit layer, wherein each arithmetic unit layer comprises one arithmetic unit or a plurality of arithmetic units arranged side by side, each arithmetic unit comprises a first housing in the shape of a cuboid, the height direction of the first housing extends along a first direction, the width direction thereof extends along a second direction perpendicular to the first direction, the length direction thereof extends along a third direction perpendicular to both the first direction and the second direction, and two ends of the first housing in the height direction are provided with a first opening and a second opening to form a coolant path extending along the first direction; and a power supply, wherein the power supply is stacked with the at least one arithmetic unit layer along the second direction or the third direction, and the height direction of the power supply is aligned with the height direction of each arithmetic unit, two ends of the power supply in the height direction are provided with a third opening and a fourth opening to form a coolant path extending along the height direction thereof, wherein the opening direction of the first opening corresponds to the opening direction of the third opening.

According to another aspect of the present disclosure, there is provided an electronic device, including:

at least one arithmetic unit layer, wherein each arithmetic unit layer comprises one arithmetic unit or a plurality of arithmetic units arranged side by side, each arithmetic unit comprises a first housing in the shape of a cuboid, the height direction of the first housing extends along a first direction, the width direction thereof extends along a second direction perpendicular to the first direction, the length direction thereof extends along a third direction perpendicular to both the first direction and the second direction, and two ends of the first housing in the height direction are provided with a first opening and a second opening to form a coolant path extending along the first direction; and a power supply, wherein the power supply is stacked with the at least one arithmetic unit layer along the second direction or the third direction, and the height direction of the power supply is aligned with the height direction of each arithmetic unit, and two ends of the power supply in the height direction are provided with a third opening and a fourth opening to form a coolant path extending along the height direction thereof, wherein the opening direction of the first opening corresponds to the opening direction of the third opening;

the arithmetic unit comprises:

the first housing;

one arithmetic module or a plurality of arithmetic modules stacked along the second direction, wherein the arithmetic module is mounted in the first housing along the first direction, the arithmetic module is inserted into the first housing from the first opening, and one side of the arithmetic module facing the first opening further comprises a connection piece; and radiators provided in pairs, wherein one pair of radiators are respectively attached to the upper and lower surfaces of one corresponding arithmetic module to absorb heat of the arithmetic module, the coolant path of the radiator extends along the first direction, and inner walls of the upper and lower surfaces of the first housing are attached to the radiator;

the arithmetic unit layer further comprises:

a first fixed plate, wherein the first fixed plate is connected to the arithmetic unit from the side of the first opening; and a second fixed plate, wherein the second fixed plate is connected to the arithmetic unit from the side of the second opening, and the second fixed plate further comprises a plurality of first restrictor holes for a coolant to flow through;

the power supply further comprises:

a power supply panel, wherein the power supply panel is connected to the power supply from the side of the third opening;

a connection terminal, wherein the connection terminal is electrically connected to the power supply and exposed to the power supply panel; and a restrictor plate, wherein the restrictor plate is connected to the power supply from the side of the fourth opening, and the restrictor plate further comprises a plurality of second restrictor holes for the coolant to flow through; and the arithmetic unit is electrically connected to the power supply through a connection between the connection piece and the connection terminal.

According to another aspect of the present disclosure, there is provided a liquid cooling apparatus for the foregoing electronic device, including:

a box body, wherein a coolant is provided in the box body, the top of the box body is provided with an operation port for entry and exit of the electronic device, the box body further has a coolant inlet and a coolant outlet, and a coolant path is formed between the coolant inlet and the coolant outlet; and the electronic device is mounted into the box body in a state in which the direction of the coolant path of each arithmetic unit is consistent with the direction of the coolant path of the cooling apparatus, and the first opening is closer to the operation port than the second opening.

BRIEF DESCRIPTION OF THE DRAWINGS

The accompanying drawings below merely provide exemplary descriptions and explanations for the present application, and do not limit the scope of the present application.

DETAILED DESCRIPTION

To have a clearer understanding of the technical features, the objectives, and the effects of the present application, specific implementations of the present application are now illustrated with reference to the accompanying drawings, and same reference numerals in the accompanying drawings represent same parts.

In this specification, "schematic" indicates "serving as an example, a case, or description", and any illustration or implementation described as "schematic" in this specification should not be interpreted as a more advantageous technical solution.

For brevity of the accompanying drawings, only parts related to the present application are schematically shown in the accompanying drawings, and do not represent an actual structure as a product. In addition, for brevity of the accompanying drawings and ease of understanding, for components with same structures or functions in some accompanying drawings, only one of the components is schematically shown or marked.

Figure 1:
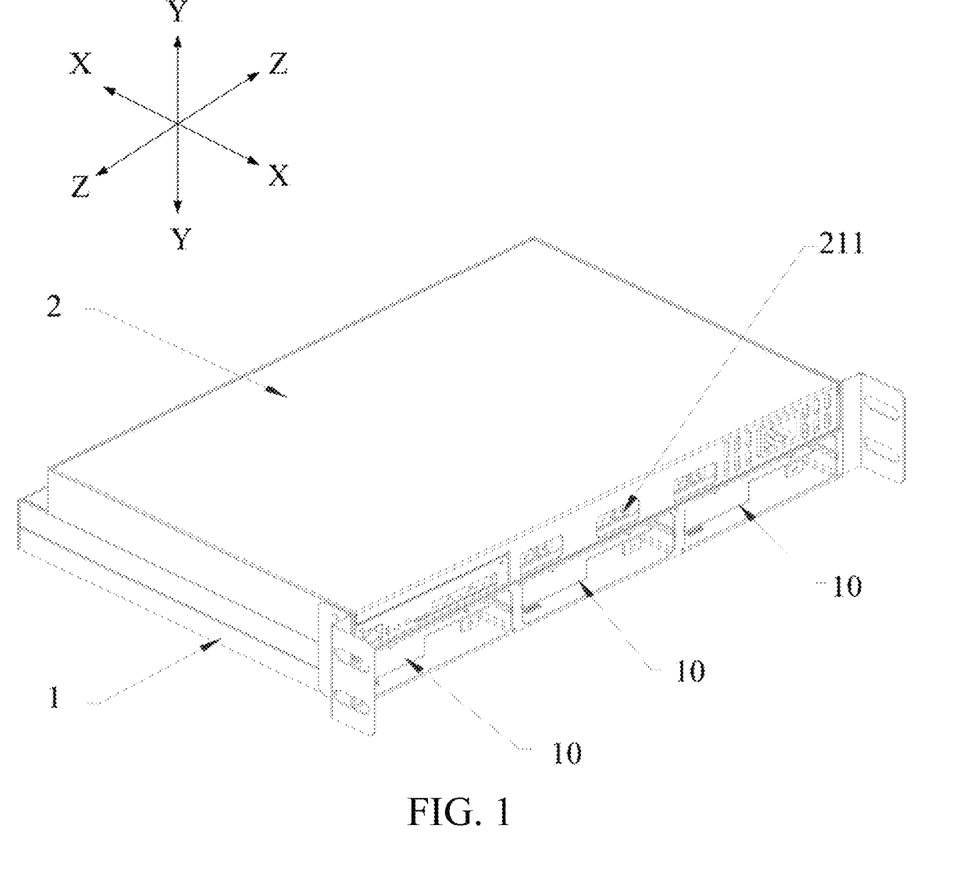
FIG. 1 is a schematic structural diagram of an electronic device according to the present application.
Figure 2:
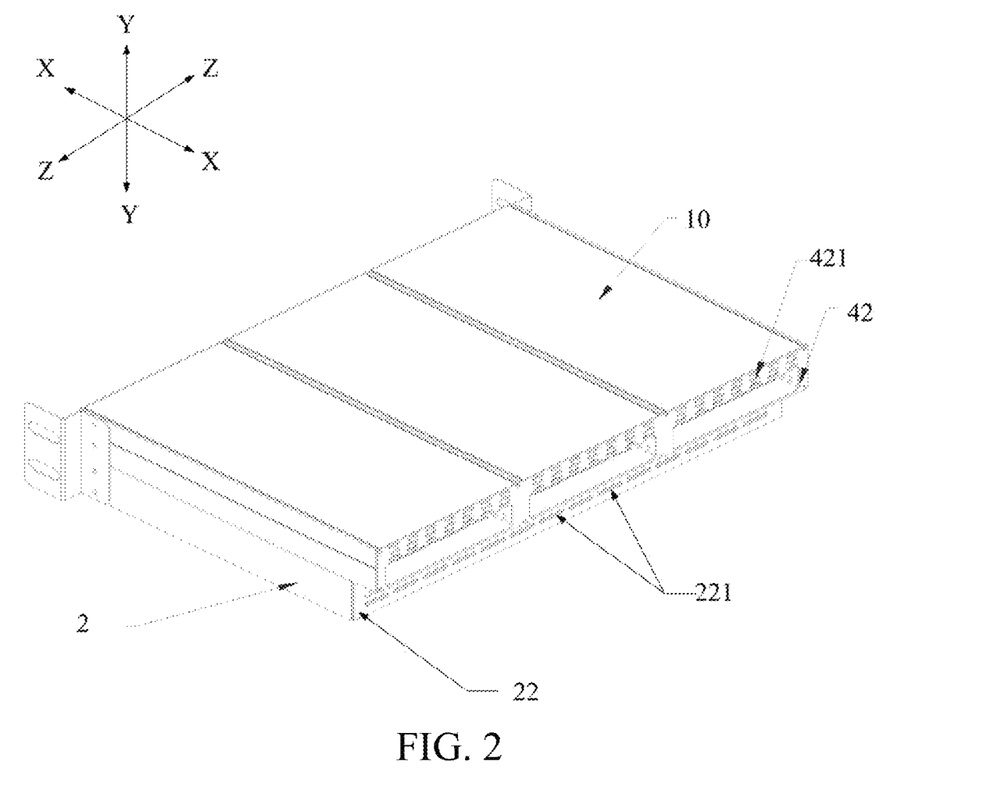
FIG. 2 is a schematic structural diagram of an electronic device according to the present application.
Figure 3:
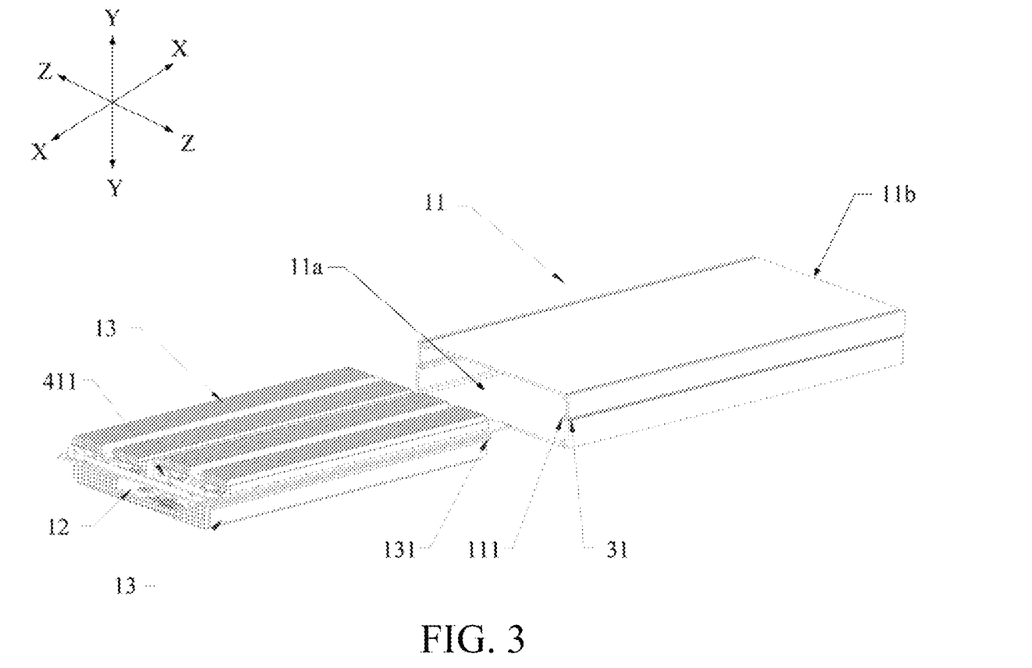
FIG. 3 is a schematic structural diagram of an arithmetic unit of an electronic device according to the present application.

FIG. 1 and FIG. 2 are schematic structural diagrams of an electronic device according to the present application, and FIG. 3 is a schematic structural diagram of an arithmetic unit of an electronic device according to the present application. As shown in FIG. 1, FIG. 2, and FIG. 3, the present application provides an electronic device, including:

at least one arithmetic unit layer 1, where each arithmetic unit layer 1 includes one arithmetic unit 10 or a plurality of arithmetic units 10 arranged side by side, each arithmetic unit 10 includes a cuboid-shaped (including cube-shaped) first housing 11, where the height direction of the first housing 11 extends along a first direction x, the width direction thereof extends along a second direction y perpendicular to the first direction x, and the length direction thereof extends along a third direction z perpendicular to both the first direction x and the second direction y, where in this embodiment, the longest side of the first housing 11 is a side in the height direction thereof, the shortest side thereof is a side in the width direction thereof, and two ends of the first housing 11 in the height direction are provided with a first opening 11a and a second opening 11b to form a coolant path extending along the first direction x; and a power supply 2, where the power supply 2 is stacked with the at least one arithmetic unit layer 1 along the second direction or the third direction, and the height direction of the power supply 2 is aligned with the height direction of each arithmetic unit 10, two ends of the power supply 2 in the height direction are provided with a third opening 2a and a fourth opening 2b to form a coolant path extending along the first direction x, where the opening direction of the first opening 11a corresponds to the opening direction of the third opening 2a.

In the drawings of this specification, the first direction x, the second direction y, and the third direction z are indicated by the directions of the coordinate system, and it should be noted that these three directions are bidirectional along the straight line extending directions, and not only include the positive or negative direction represented by a single arrow.

FIG. 1 and FIG. 2 provide illustration by using an example in which an electronic device includes one arithmetic unit layer 1 and the arithmetic unit layer 1 includes three arithmetic units 10 arranged side by side, but the electronic device in the present application may also include a plurality of arithmetic unit layers 1, and each arithmetic unit layer 1 may include only one arithmetic unit 10 or a plurality of arithmetic units 10.

The electronic device in this embodiment may be a liquid cooling server, a liquid cooling virtual currency mining machine, or the like, which is an electronic device that uses immersion coolant for cooling, and the electronic device in this embodiment needs to be placed in a liquid cooling device as a whole for cooling and heat dissipation.

The electronic device in this embodiment adopts a modular arrangement, and includes an arithmetic unit 10 and a power supply 2, where the power supply 2 is configured to provide power for one or more arithmetic units 10. Components such as a control panel and a controller may also be integrated into the power supply 2. Generally, the arithmetic unit 10 is in the shape of a cuboid, and in this embodiment, the direction of the longest side of the cuboid is defined as the height direction, and the direction of the shortest side of the cuboid is defined as the width direction. The definition is only for distinction and description, but not for limitation.

Figure 4:
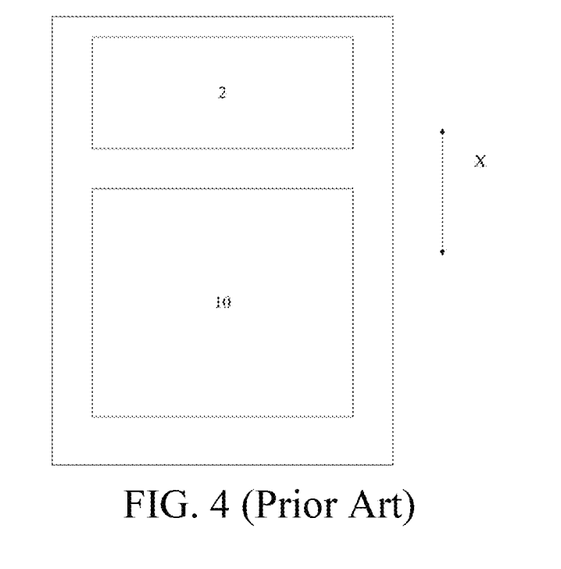
FIG. 4 is a schematic structural diagram of an existing electronic device.

In the prior art, an arithmetic unit module and a power supply module are usually arranged in sequence along the height direction of the arithmetic unit, as shown in FIG. 4 for example, the overall length of the coolant path of the electronic device in this case is not only the length of the coolant path of the arithmetic unit or the power supply, but the combined length of the coolant paths of the arithmetic unit and the power supply along the first direction (x direction), which is greater than the length of the coolant path of the arithmetic unit, thus the overall electronic device is excessively long and the structure is not compact, which further leads to an increase in the flow path of a coolant in the electronic device and an increase in the resistance of the coolant, resulting in prolongation of the single circulation time of the coolant and low heat dissipation efficiency.

Figure 11:
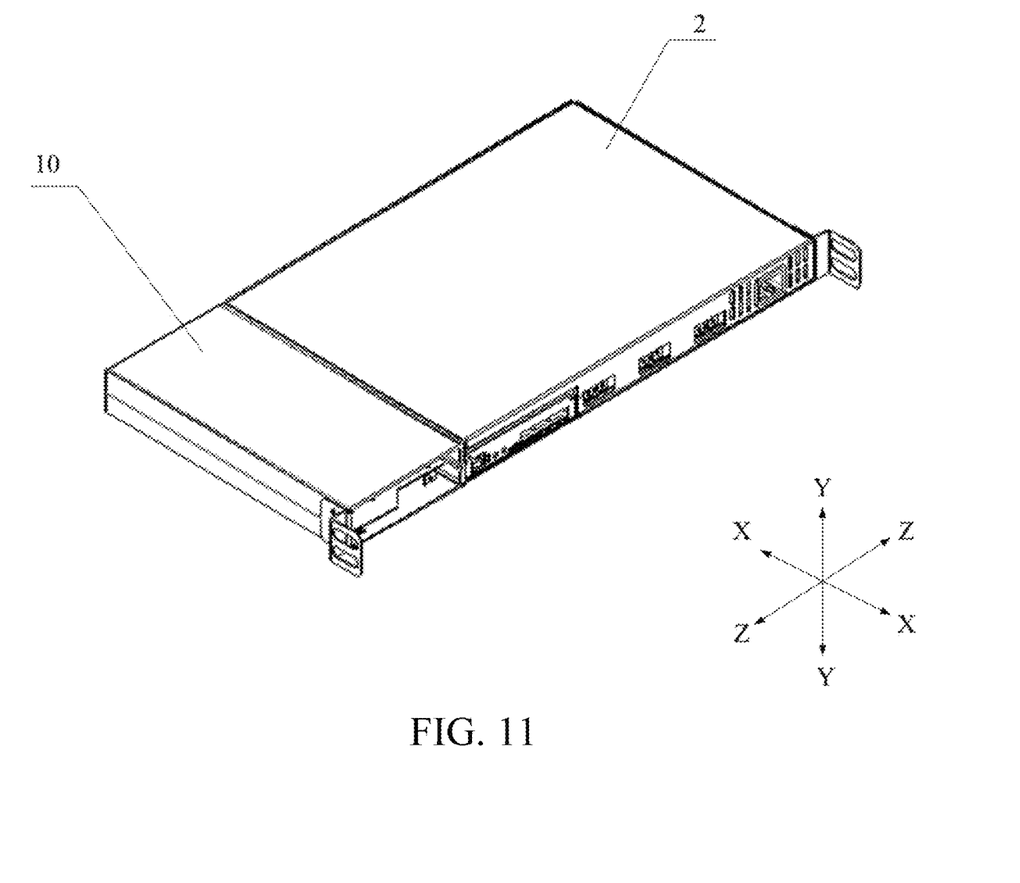
FIG. 11 is a schematic structural diagram of an embodiment of an electronic device according to the present application.

In this embodiment, the arithmetic unit layer 1 including one or more arithmetic units 10 is stacked with the power supply 2 along the second direction or the third direction, and in the embodiment shown in FIG. 1, the arithmetic unit layer 1 is stacked with the power supply 2 along the second direction y, while in the embodiment shown in FIG. 11, the arithmetic unit layer 1 is stacked with the power supply 2 along the third direction z.

By comparing FIG. 1 and FIG. 4, it can be seen that in this embodiment, the arrangement manner in which the arithmetic units and the power supply are arranged in sequence along the extending direction of the coolant path is optimized to a manner of being stacked along the extending direction perpendicular to the coolant path, in this way, the size can be shortened in the extending direction of the coolant path of the arithmetic unit, so that the length of the coolant path of the entire electronic device is the maximum value rather than the sum value of the lengths in the arithmetic unit and the power supply, thus not only the length of the coolant path can be shortened, but also the size gaps of the electronic device in all directions can be narrowed under the condition that the total volume of the electronic device remains unchanged, which makes the structure of the electronic device more compact, thereby being more convenient to be placed in a cooling apparatus, and makes the structure of the cooling apparatus that is used in cooperation more compact.

Further, the modular arrangement manner in this embodiment can flexibly adjust the overall size of the electronic device. Specifically, when the sizes of the power supply 2 and the arithmetic unit 10 are fixed, the power supply 2 is stacked with the arithmetic unit layer 1, so that the quantity of arithmetic units 10 included in each arithmetic unit layer 1 can be adjusted to make the size of the arithmetic unit layer 1 in the length direction of the arithmetic unit 10 equivalent to the length size of the power supply 2, and therefore, the electronic device can have a relatively regular appearance shown in FIG. 1. When the quantity of arithmetic units 10 exceeds the quantity of arithmetic units 10 that can be included in one arithmetic unit layer 1, it is only necessary to form a plurality of arithmetic unit layers 1 from the arithmetic units 10. Due to the modular arrangement manner, the size of the power supply 2 and each arithmetic unit 10 can also be adjusted, so that the sizes of the arithmetic unit layer 1 and the power supply 2 can match each other in, for example, the first direction, by adjusting the size of each module. Such an arrangement manner can not only make the structure of the electronic device more compact, but also facilitate the capacity expansion as well as disassembly and assembly of the electronic device.

Further, the stacking manner in this embodiment greatly shortens the distance between each arithmetic unit 10 and the power supply 2, which can shorten the wiring height between the arithmetic unit 10 and the power supply 2 and facilitate mounting operations.

Figure 5:
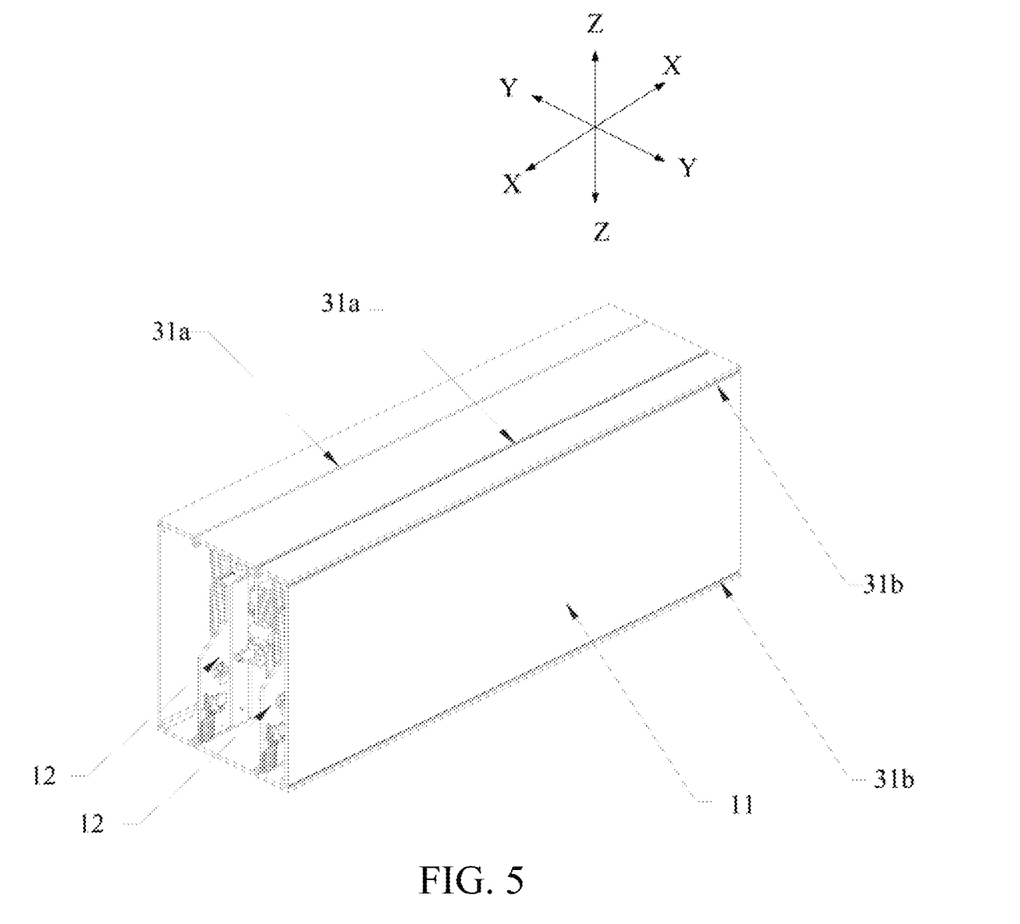
FIG. 5 is a schematic structural diagram of an arithmetic unit of an electronic device according to the present application.

FIG. 3 and FIG. 5 are schematic structural diagrams of an arithmetic unit of an electronic device according to the present application. As shown in FIG. 3 and FIG. 5, the arithmetic unit 10 includes:

a first housing 11, where the first housing 11 has a cuboid structure, two ends thereof in the height direction thereof (along the first direction x) are provided with a first opening 11a and a second opening 11b, and the coolant path of the arithmetic unit is formed between the openings on the two ends;

one arithmetic module 12 or a plurality of arithmetic modules 12 stacked along the width direction of the first housing 11, where the arithmetic module(s) 12 are mounted in the first housing 11 along the first direction x, where FIG. 3 illustrates a case that the first housing 11 includes one arithmetic module 12 therein, while FIG. 5 illustrates a case that the first housing 11 includes a plurality of arithmetic modules 12 therein, where FIG. 5 illustrates a case that one arithmetic unit 10 includes two arithmetic modules 12 therein, where the arithmetic modules 12 has a plate-like structure, and extends along the first direction x, then the upper and lower surfaces of the arithmetic module 12 are two side surfaces thereof determined by the first direction x and the third direction z; and radiators 13 provided in pairs, where one pair of radiators 13 are respectively attached to the upper and lower surfaces of a corresponding arithmetic module 12 to absorb heat of the arithmetic module 12, the coolant path of the radiator 13 extends along the height direction of the first housing 11, and the radiator 13 is attached to inner walls of the upper and lower surfaces of the first housing 11.

In this embodiment, the direction of the coolant path of the electronic device is the direction of the coolant path of each arithmetic unit 10, and in each arithmetic unit 10, the direction of the coolant path is the direction of its longest side, so that the coolant path of the coolant in each arithmetic unit 10 is the longest, and therefore the arithmetic module can be sufficiently cooled by the coolant; and in the whole electronic device, the length of the coolant path is the maximum value rather than the sum value of the lengths of the coolant paths in the arithmetic unit and the power supply, which can shorten the path length of the coolant in the whole electronic device, thereby improving the heat dissipation efficiency.

To improve the heat dissipation efficiency and reduce the coolant flow resistance, the coolant path of the radiator 13 extends along the height direction of the first housing 11, for example, the radiator 13 is in the form of a plurality of heat dissipation fins, then the gaps between each heat dissipation fin are the coolant path of the radiator 13, therefore, the extending direction of the heat dissipation fins of the radiator 13 is the height direction of the first housing 11.

Each arithmetic module 12 corresponds to one pair of radiators 13, and the pair of radiators 13 are respectively attached to the upper and lower surfaces of the arithmetic module 12 to fully absorb heat of the arithmetic module 12 and exchange heat with the coolant flowing through.

To facilitate the disassembly and assembly of the arithmetic module, the arithmetic unit in this embodiment may be mounted in a pluggable manner. Specifically, as shown in FIG. 3 and FIG. 6, the inner walls of the left side surface and the right side surface of the first housing 11 further include a guide rail 111 extending along the height direction of the first housing 11; the left and right sides of one radiator 13 (shown as one radiator located under the arithmetic module 12 in the figure) of the radiators 13 provided in pairs further include a mounting guide groove 131 that slidably fits the guide rail 111, the radiator 13 is fixed integrally with the arithmetic module 12, and the arithmetic module 12 is inserted into the first housing 11 from the first opening 11a through the slidable fitting between the mounting guide groove 131 and the guide rail 111.

In an embodiment, the guide rail 111 has a structure protruding inward from the inner wall of the first housing 11.

Figure 6:
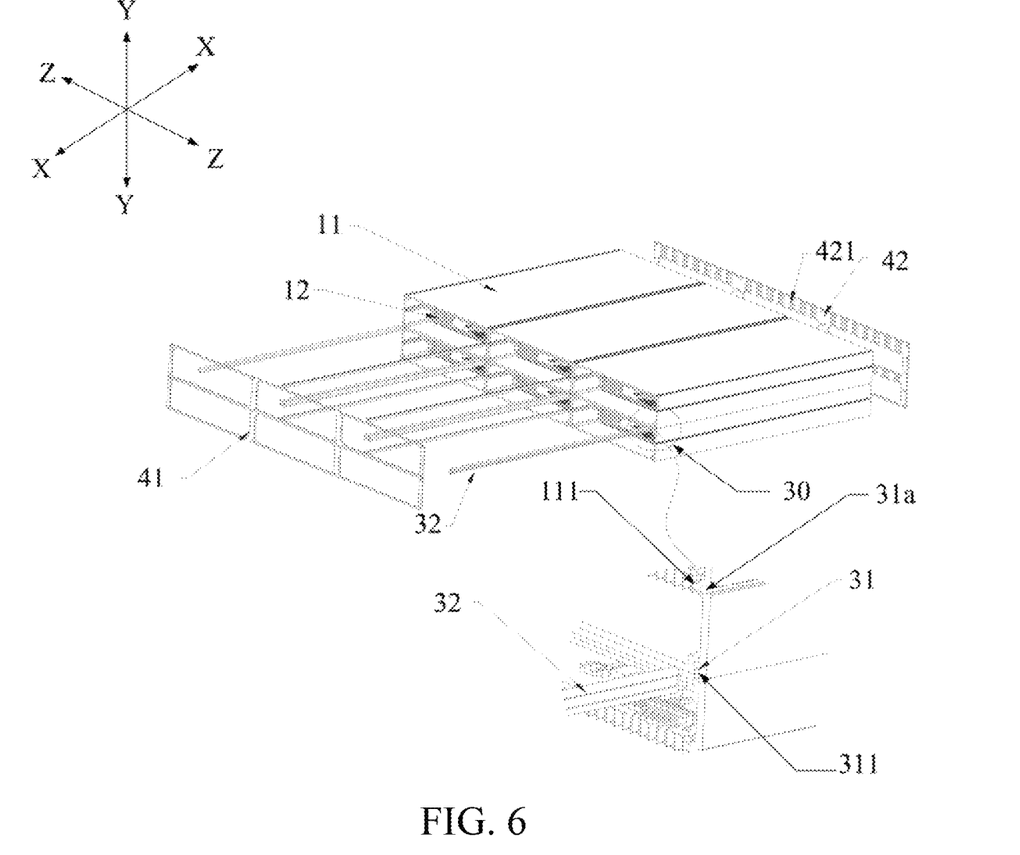
FIG. 6 is an exploded view of an embodiment of an arithmetic unit layer of an electronic device according to the present application.

FIG. 6 is an exploded view of an embodiment of an arithmetic unit layer of an electronic device according to the present application. In an embodiment, as shown in FIG. 6, the electronic device in this embodiment further includes an arithmetic unit connection mechanism 30, where the arithmetic unit connection mechanism 30 includes:

- a splicing groove 31, where the splicing groove 31 is concave from the outer surface of the first housing 11 and is provided along the height direction of the first housing 11, and the splicing groove 31 has a constriction portion 311 provided on the outer surface of the first housing 11; and
- a splicing column 32, where the height of the splicing column 32 corresponds to the height of the first housing 11, two ends of a cross section of the splicing column 32 respectively correspond to the splicing grooves 31 of two adjacent arithmetic units 10 in shape, and the splicing column 32 is inserted into the corresponding splicing grooves 31 of the two adjacent arithmetic units 10 to connect the two arithmetic units 10 together.

Specifically, as shown in the enlarged view in FIG. 6, the splicing groove 31 has a constriction portion 311 provided on the outer surface of the first housing 11, that is, the diameter of the constriction portion 311 is smaller than the diameter of the splicing groove 31, so that when the splicing column 32 is inserted into the splicing grooves 31, the constriction portions 311 can limit the movement of the splicing column 32 in the direction perpendicular to the outer surface of the first housing 11 to limit the splicing column 32 in the splicing grooves 31. Two ends of a cross section of each splicing column 32 correspond to two opposite splicing grooves 31 in shape respectively, so that two adjacent first housings 11 are connected together by one splicing column 32.

In this embodiment, the splicing groove 31 is concave from the outer surface of the first housing 11, and is formed by using the sidewall space of the first housing 11, and no protruding structure is formed outside of the first housing 11, so that during splicing between a plurality of arithmetic units, two adjacent first housings 11 can be attached in plane, thereby forming a compact structure.

The arithmetic unit connection mechanism 30 in this embodiment is simple in structure and convenient in operation, and can quickly splice the first housings 11 from the width direction or the length direction and firmly connect them together. Further, the connection mechanism in this embodiment is embedded in the sidewall space of the first housing, without producing a structure protruding from the outer surface of the first housing, so that a plane-attached splicing structure can be formed without increasing the volume of the first housing.

In this embodiment, two adjacent arithmetic units 10 may be spliced in the width direction or the length direction, thus, as shown in FIG. 6, the splicing groove 31 is provided at a corresponding position of a contact surface of the first housing 11 in stacking, for example, at corresponding positions of the left side surface and the right side surface of the first housing 11, and/or at corresponding positions of the upper surface and the lower surface of the first housing 11.

For example, as shown in FIG. 5, the splicing groove 31 includes a first splicing groove 31a provided at corresponding positions of the left side surface and the right side surface (which are surfaces determined by the first direction x and the second direction y) of the first housing 11, and a second splicing groove 31b provided at corresponding positions of the upper surface and the lower surface (which are surfaces determined by the first direction x and the third direction z) of the first housing 11.

Each surface may be provided with one or more splicing grooves. For example, the second splicing groove 31b located on the upper surface of the first housing 11 can be provided at two end corners of the upper surface of the first housing 11, then as shown in FIG. 5, the thickness of the end corners of the inner wall of the first housing 11 can be increased for providing the concave second splicing groove 31b, which does not increase the thickness of the entire first housing 11, but only partially achieves two functions of structural arrangement and strength enhancement.

As shown in FIG. 5 and FIG. 6, the position of the first splicing groove 31a corresponds to the position of the guide rail 111, and in an embodiment, the guide rail 111 has a structure protruding inward from the inner wall of the first housing 11, then the first splicing groove 31a can be correspondingly concave in the guide rail 111, so that the strength is increased at the position of the first splicing groove 31a by the guide rail 111 to further avoid an increase to the thickness of the first housing.

Figure 7:
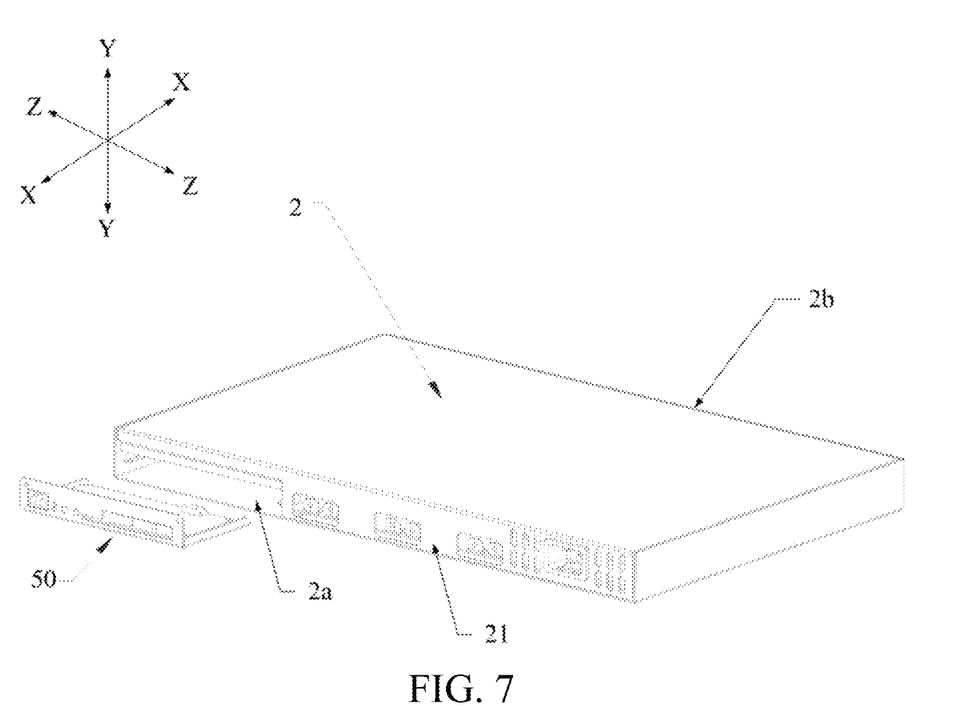
FIG. 7 is a schematic structural diagram of a power supply of an electronic device according to the present application.

As shown in FIG. 1, FIG. 3 and FIG. 6, an arithmetic unit layer 1 further includes:

- a first fixed plate 41, where the first fixed plate 41 is connected to an arithmetic unit 10 from the side of the first opening 11a; and
- a second fixed plate 42, where the second fixed plate 42 is connected to the arithmetic unit 10 from the side of the second opening 11b, and the second fixed plate 42 further includes a plurality of first restrictor holes 421 for a coolant to flow through;

as shown in FIG. 1, FIG. 2 and FIG. 7, a power supply 2 further includes:

a power supply panel 21, where the power supply panel 21 is connected to the power supply 2 from the side of the third opening 2a;

a connection terminal 211, where the connection terminal is electrically connected to the power supply 2 and exposed to the power supply panel 21; and a restrictor plate 22, where the restrictor plate 22 is connected to the power supply 2 from the side of the fourth opening 2b, and the restrictor plate 22 further includes a plurality of second restrictor holes 221 for the coolant to flow through;

and as shown in FIG. 3, one side of the arithmetic module 12 facing the first opening 11a further includes a connection piece 411, and the arithmetic unit 10 is electrically connected to the power supply 2 through a connection between the connection piece 411 and the connection terminal 211.

The quantity, arrangement position, and size of the first restrictor holes 421 and the second restrictor holes 221 can all have an impact on the flow of the coolant, and the flow of the coolant flowing through the electronic device can be adjusted by changing the parameters so as to adjust the heat dissipation effect accordingly. For example, to adapt to the difference in heat dissipation between the upper and lower surfaces of the arithmetic module, the parameters of the first restrictor holes 421 corresponding to the radiator positions on the upper and lower surfaces of the arithmetic module can be adjusted accordingly. The first restrictor holes 421 and the second restrictor holes 221 may correspond to only one of the radiators on the upper and lower surfaces of the arithmetic module.

Further, the first fixed plate 41 can be provided with a maintenance channel hole to facilitate disassembly of the arithmetic module 12. The arithmetic module 12 is inserted and removed from the side of the first opening 11a. Therefore, when the arithmetic module needs to be maintained or replaced, the arithmetic module can be taken out only by removing the first fixed plate and a connecting cable or the like connected thereto without moving the entire electronic device.

The quantity of connection terminals 211 is greater than or equal to the quantity of arithmetic units 10 in the electronic device. That is, some of the connection terminals 211 can be used as backup interfaces to be suitable for the case in which some of the connection terminals are damaged or for the case in which the arithmetic units are increased or decreased.

Figure 8:
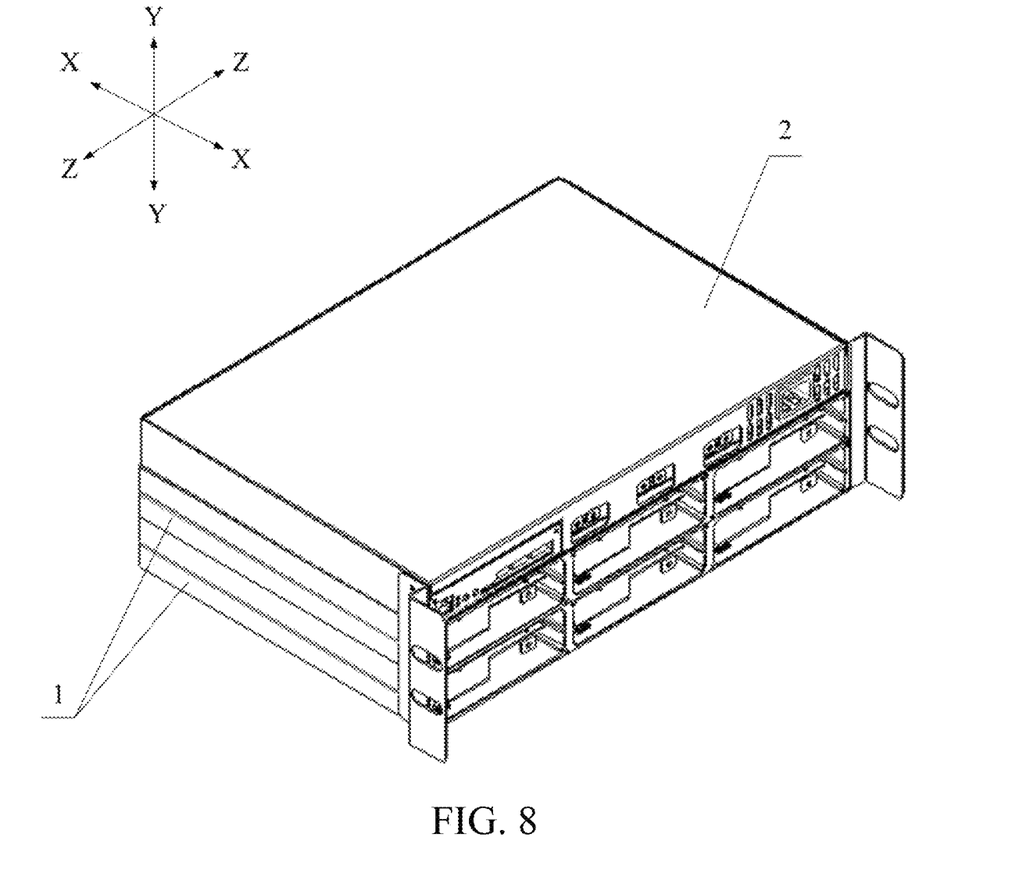
FIG. 8 and FIG. 9 are schematic structural diagrams of an embodiment of an electronic device according to the present application.
Figure 9:
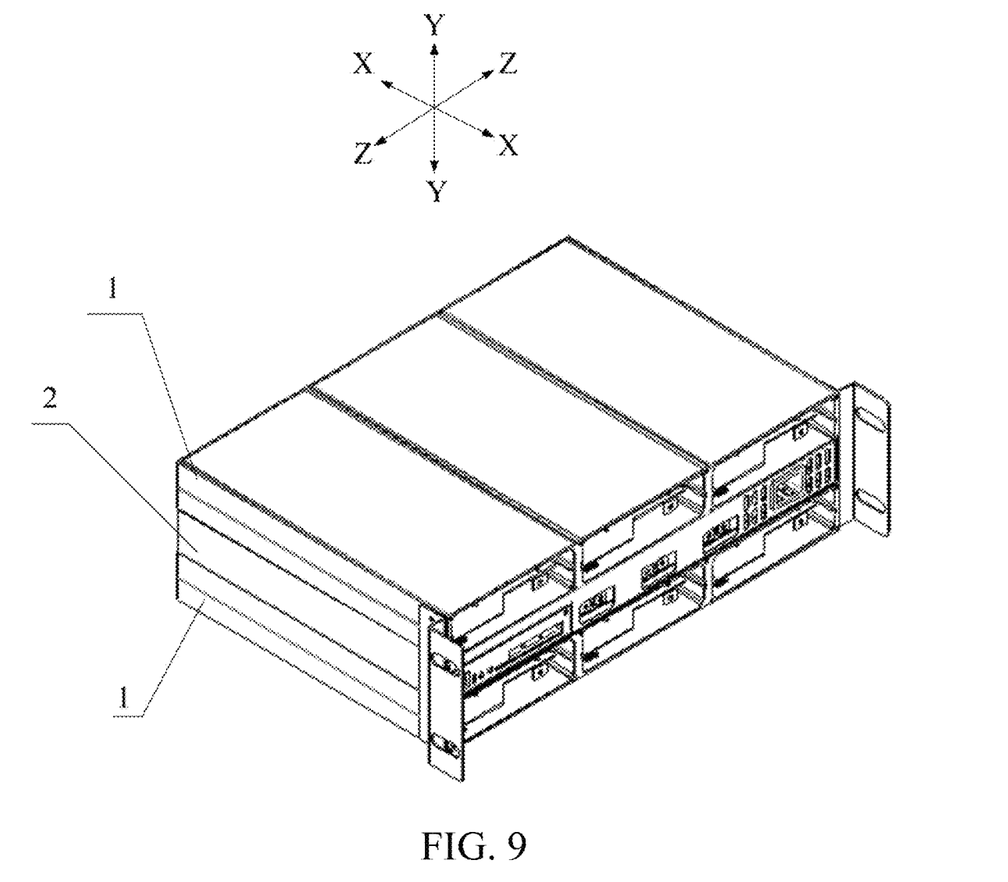

In this embodiment, an electronic device may include a plurality of arithmetic unit layers 1, and the plurality of arithmetic unit layers 1 are stacked along the width direction of a first housing 11, where the power supply 2 may be located at the bottom or the top of all the arithmetic unit layers 1 in the width direction of the first housing 11 as shown in FIG. 8, or arranged between two arithmetic unit layers 1 in the width direction of the first housing 11 as shown in FIG. 9. The manner shown in FIG. 9 can further shorten the distance between the arithmetic unit 10 and the power supply 2, thereby arranging the layout of connecting cables more properly.

It can be learned from the foregoing technical solutions that in this embodiment, the power supply is stacked with the arithmetic unit layer including one or more arithmetic units along the width direction of each arithmetic unit, and in this embodiment, the arrangement manner of the arithmetic units and the power supply located at the same plane is optimized to a stacking manner, in this way, the size gap of the electronic device in all directions can be narrowed under the condition that the total volume of the electronic device remains unchanged, which makes the structure of the electronic device more compact, thereby being more convenient to be placed in a cooling apparatus, and makes the structure of the cooling apparatus that is used in cooperation more compact.

Further, the modular arrangement manner in this embodiment can flexibly adjust the overall size of the electronic device. Specifically, the power supply is stacked with the arithmetic unit layer, so that the quantity of arithmetic units included in each arithmetic unit layer can be adjusted to make the size of the arithmetic unit layer in the length direction of the arithmetic unit equivalent to the length size of the power supply, and therefore, the electronic device can have a relatively regular appearance. When the quantity of arithmetic units exceeds the quantity of arithmetic units that can be included in one arithmetic unit layer, it is only necessary to form a plurality of arithmetic unit layers from the arithmetic units. Such an arrangement manner can not only make the structure of the electronic device more compact, but also facilitate the capacity expansion as well as disassembly and assembly of the electronic device.

Further, the stacking manner of the embodiments greatly shortens the distance between each arithmetic unit and the power supply, which can shorten the wiring height between the arithmetic unit and the power supply and facilitate mounting operations.

In an embodiment, as shown in FIG. 7, an electronic device in this embodiment further includes a control module 50, where the control module 50 is integrated in the power supply 2, and the control module 50 is electrically connected to the power supply 2. Arrangement of the control module 50 on the power supply 2 can shorten the height of a connecting cable between the control module 50 and the power supply 2, and the electrical connection thereof can be arranged inside the power supply 2.

Figure 10:
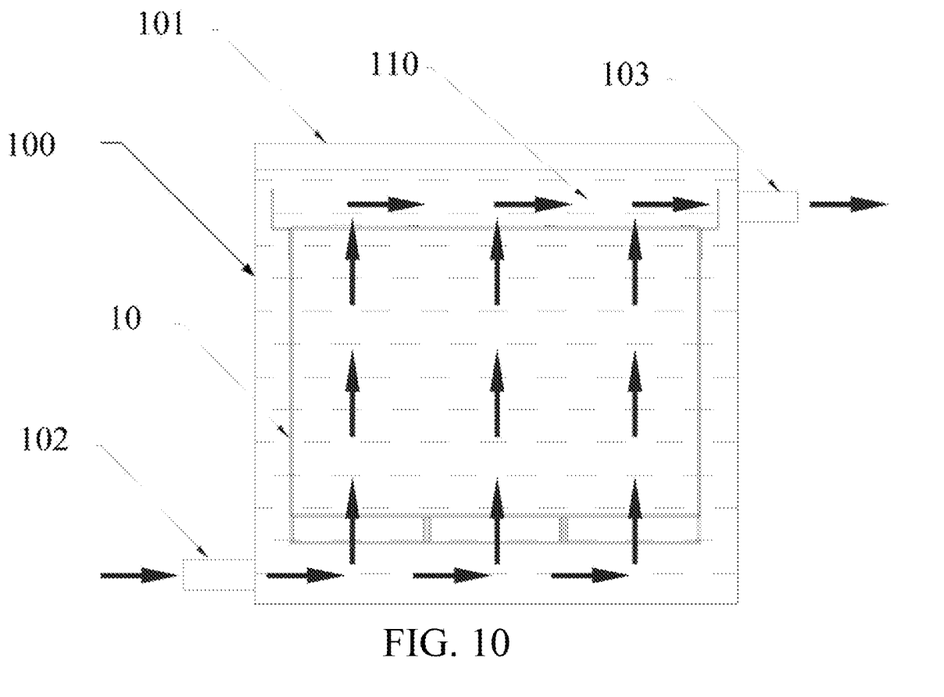
FIG. 10 is a schematic structural diagram of a cooling apparatus for an electronic device according to the present application.

Another embodiment of the present application further provides a cooling apparatus for the foregoing electronic device, as shown in FIG. 10, the cooling apparatus includes:

a box body 100, where a coolant 110 is provided in the box body 100, the top of the box body 100 is provided with an operation port 101 for entry and exit of the electronic device, the box body 100 further has a coolant inlet 102 and a coolant outlet 103, a coolant path is formed between the coolant inlet 102 and the coolant outlet 103, and the coolant inlet 102 is located below the coolant outlet 103;

and the electronic device is mounted into the box body 100 in a state in which the direction of the coolant path of each arithmetic unit 10 is consistent with the direction of the coolant path of the cooling apparatus, and the first opening 11a is closer to the operation port 101 than the second opening 11b.

In this embodiment, the top of the box body 100 is provided with an operation port 101, and the top of the box body 100 herein refers to the side facing the operator, and is not necessarily to be the top in the vertical direction. Because a plug port of the arithmetic module, the connecting cable of the electronic device and the like are all arranged on the side of the first opening 11a of the arithmetic unit, the electronic device is put into the box body 100 of the cooling apparatus in a direction in which the first opening 11a faces the operation port 101, so that the highest heat dissipation efficiency can be achieved through the consistent direction of the coolant paths, and when the arithmetic module needs to be maintained, the operator only needs to unplug the cable connected to the arithmetic module after the power is cut off, and the arithmetic module can be taken out for maintenance without taking out of the entire electronic device, which facilitates maintenance operations.

It can be seen from the foregoing technical solutions that, for problem that the internal layout of the liquid cooling electronic device in the prior art is not beneficial to the uniformity of the flow of the coolant flowing through the interior of the electronic device, and the problem of uneven distribution of the coolant inside the electronic device due to the incompact structure of the electronic device, in the electronic device of the present application, the power supply is stacked with the arithmetic unit layer to narrow the size gap of the electronic device in all directions, which makes the structure of the electronic device more compact, thereby being more convenient to be placed in a cooling apparatus, and makes the structure of the cooling apparatus that is used in cooperation more compact. In addition, in each arithmetic unit, the arithmetic modules are evenly arranged inside the first housing, and the entire interior of the first housing is filled with the radiator, so that the coolant can flow through the radiator evenly, thereby improving the heat dissipation efficiency.

In the electronic device of the present application, by changing the layout to make the structure of the electronic device more compact, the overall height of the electronic device is reduced under the condition that the overall volume of the electronic device remains unchanged, which can facilitate the operator in lifting the electronic device from the cooling apparatus. In addition, by setting the insertion and removal direction of the arithmetic module to being facing the operation port of the cooling apparatus, each arithmetic module can be conveniently inserted and removed, so that the arithmetic module can be conveniently taken out for maintenance without taking out of the entire electronic device.

In this specification, "a" and "an" do not mean to limit the quantity of relevant parts of the present application to "only one", and "a" and "an" do not mean to exclude the situation that the quantity of relevant parts of the present application is "two or more".

Unless otherwise described, numerical ranges in this specification include not only the entire range between two endpoints thereof, but also several subranges subsumed therein.

The series of detailed descriptions listed above are only detailed descriptions for the feasible implementations of the present application, and are not intended to limit the protection scope of the present application, any equivalent implementations or changes made without departing from the technical spirit of the present application, such as combination, division or repetition of features, should fall within the protection scope of the present application.

What is claimed is:

1. An electronic device comprising:
    at least one arithmetic unit layer, wherein each arithmetic unit layer comprises one arithmetic unit or a plurality of arithmetic units arranged side by side, each arithmetic unit comprises a first housing in a shape of a cuboid, a first side direction of the first housing extends along a first direction, a second side direction thereof extends along a second direction perpendicular to the first direction, a third side direction thereof extends along a third direction perpendicular to both the first direction and the second direction, and two ends of the first housing in the first side direction thereof are provided with a first opening and a second opening to form a coolant path extending along the first direction, wherein the arithmetic unit can be inserted and removed relative to the first housing along the first side direction of the first housing through the first opening; and
    a power supply, wherein the power supply is stacked with the at least one arithmetic unit layer along the second direction or the third direction, and a first side direction of the power supply is aligned with the first side direction of each arithmetic unit, two ends of the power supply in the first side direction thereof are provided with a third opening and a fourth opening to form a coolant path extending along the first side direction thereof, wherein an opening direction of the first opening corresponds to an opening direction of the third opening.

2. The electronic device according to claim 1, further comprising an arithmetic unit connection mechanism, wherein the arithmetic unit connection mechanism comprises:
    a splicing groove, wherein the splicing groove is concave from an outer surface of the first housing and is provided along the first side direction of the first housing, and the splicing groove has a constriction portion provided on the outer surface of the first housing; and
    a splicing column, wherein the first side of the splicing column corresponds to the first side of the first housing, two ends of a cross section of the splicing column respectively correspond to the splicing grooves of two adjacent arithmetic units in shape, and the splicing column is inserted into the corresponding splicing grooves of the two adjacent arithmetic units to connect the two arithmetic units together.

3. The electronic device according to claim 2, wherein the splicing groove is provided at a corresponding position of a contact surface for stacking of the first housing.

4. The electronic device according to claim 2, wherein the electronic device comprises a plurality of arithmetic unit layers, the plurality of arithmetic unit layers are stacked along the second direction, and the power supply is located on one side of all the arithmetic unit layers in the second direction; or
    the electronic device comprises a plurality of arithmetic unit layers, and the power supply is arranged between two arithmetic unit layers in the second direction.

5. The electronic device according to claim 2, wherein the arithmetic unit comprises:
    the first housing;
    one arithmetic module or a plurality of arithmetic modules stacked along the second direction, wherein the arithmetic module is mounted in the first housing along the first direction; and
    radiators provided in pairs, wherein one pair of radiators are respectively attached to the upper and lower surfaces of one corresponding arithmetic module to absorb heat of the arithmetic module, a coolant path of the radiator extends along the first direction, and inner walls of the upper and lower surfaces of the first housing are attached to the radiator.

6. The electronic device according to claim 5, wherein the inner wall of the first housing extending along the first direction and the second direction further comprises a guide rail extending along the first direction;
    two sides of one of the radiators provided in pairs extending along the first direction further comprises a mounting guide groove that slidably fits the guide rail, and the arithmetic module is inserted into the first housing from the first opening through a slidable fitting between the mounting guide groove and the guide rail.

7. The electronic device according to claim 6, wherein the splicing groove comprises a first splicing groove provided at a corresponding position of the outer surface of the first housing extending along the first direction and the second direction, and a second splicing groove provided at a corresponding position of the outer surface of the first housing extending along the first direction and the third direction; and the position of the first splicing groove corresponds to a position of the guide rail.

8. The electronic device according to claim 5, wherein the arithmetic unit layer further comprises:
a first fixed plate, wherein the first fixed plate is connected to the arithmetic unit from a side of the first opening; and
a second fixed plate, wherein the second fixed plate is connected to the arithmetic unit from a side of the second opening, and the second fixed plate further comprises a plurality of first restrictor holes for a coolant to flow through;

the power supply further comprises:
a power supply panel, wherein the power supply panel is connected to the power supply from a side of the third opening,
a connection terminal, wherein the connection terminal is electrically connected to the power supply and exposed to the power supply panel; and
a restrictor plate, wherein the restrictor plate is connected to the power supply from a side of the fourth opening, and the restrictor plate further comprises a plurality of second restrictor holes for the coolant to flow through; and
one side of the arithmetic module facing the first opening further comprises a connection piece, and the arithmetic unit is electrically connected to the power supply through a connection between the connection piece and the connection terminal.

9. The electronic device according to claim 1, further comprising a control module, wherein the control module is integrated in the power supply, and the control module is electrically connected to the power supply.

10. An electronic device, wherein the electronic device comprises:
at least one arithmetic unit layer, wherein each arithmetic unit layer comprises one arithmetic unit or a plurality of arithmetic units arranged side by side, each arithmetic unit comprises a first housing in a shape of a cuboid, a first side direction of the first housing extends along a first direction, a second side direction thereof extends along a second direction perpendicular to the first direction, a third side direction thereof extends along a third direction perpendicular to both the first direction and the second direction, and two ends of the first housing in the first side direction thereof are provided with a first opening and a second opening to form a coolant path extending along the first direction, wherein the arithmetic unit can be inserted and removed relative to the first housing along the first side direction of the first housing through the first opening; and
a power supply, wherein the power supply is stacked with the at least one arithmetic unit layer along the second direction or the third direction, and a first side direction of the power supply is aligned with the first side direction of each arithmetic unit, and two ends of the power supply in the first side direction thereof are provided with a third opening and a fourth opening to form a coolant path extending along the first side direction thereof, wherein an opening direction of the first opening corresponds to an opening direction of the third opening;

the arithmetic unit comprises:
the first housing;
one arithmetic module or a plurality of arithmetic modules stacked along the second direction, wherein the arithmetic module is mounted in the first housing along the first direction, the arithmetic module is inserted into the first housing from the first opening, and one side of the arithmetic module facing the first opening further comprises a connection piece; and
radiators provided in pairs, wherein one pair of radiators are respectively attached to the upper and lower surfaces of one corresponding arithmetic module to absorb heat of the arithmetic module, a coolant path of the radiator extends along the first direction, and inner walls of the upper and lower surfaces of the first housing are attached to the radiator;

the arithmetic unit layer further comprises:
a first fixed plate, wherein the first fixed plate is connected to the arithmetic unit from a side of the first opening; and
a second fixed plate, wherein the second fixed plate is connected to the arithmetic unit from a side of the second opening, and the second fixed plate further comprises a plurality of first restrictor holes for a coolant to flow through;

the power supply further comprises:
a power supply panel, wherein the power supply panel is connected to the power supply from a side of the third opening;
a connection terminal, wherein the connection terminal is electrically connected to the power supply and exposed to the power supply panel; and
a restrictor plate, wherein the restrictor plate is connected to the power supply from a side of the fourth opening, and the restrictor plate further comprises a plurality of second restrictor holes for the coolant to flow through; and
the arithmetic unit is electrically connected to the power supply through a connection between the connection piece and the connection terminal.

11. A liquid cooling apparatus for the electronic device according to claim 10, wherein the liquid cooling apparatus comprises:
a box body, wherein a coolant is provided in the box body, a top of the box body is provided with an operation port for entry and exit of the electronic device, the box body further has a coolant inlet and a coolant outlet, and a coolant path is formed between the coolant inlet and the coolant outlet; and
the electronic device is mounted into the box body in a state in which the direction of the coolant path of each arithmetic unit is consistent with the direction of a coolant path of the cooling apparatus, and the first opening is closer to the operation port than the second opening.

* * * * *